United States Patent [19]

Lee et al.

[11] Patent Number: 5,757,441
[45] Date of Patent: May 26, 1998

[54] METHOD AND APPARATUS FOR PERFORMING AUTOMATIC CHANNEL SELECTION AND AUTOMATIC TUNER DIAGNOSIS IN A DOUBLE-TUNER TELEVISION RECEIVER

[75] Inventors: Sang-su Lee, Suwon; Chang-wan Hong, Anyang, both of Rep. of Korea

[73] Assignee: Samsung Electronics Co., Ltd., Kyungki-Do, Rep. of Korea

[21] Appl. No.: 684,741

[22] Filed: Jul. 22, 1996

[30] Foreign Application Priority Data

Jul. 21, 1995 [KR] Rep. of Korea .................... 95-21569

[51] Int. Cl.$^6$ ............................................... H04N 5/44
[52] U.S. Cl. ........................... 348/731; 348/732; 348/563
[58] Field of Search ................................ 348/725, 731, 348/732, 441, 569, 563, 564; H04N 5/44

[56] References Cited

U.S. PATENT DOCUMENTS

| | | | |
|---|---|---|---|
| 5,034,820 | 7/1991 | Cho | 358/192.1 |
| 5,296,931 | 3/1994 | Na | 348/731 |
| 5,311,317 | 5/1994 | Ogura et al. | 348/725 |
| 5,382,982 | 1/1995 | Enomoto | 348/725 |
| 5,428,405 | 6/1995 | Lee | 348/731 |
| 5,436,675 | 7/1995 | Hayashi et al. | 348/725 |
| 5,461,427 | 10/1995 | Duffield et al. | 348/555 |

*Primary Examiner*—Glenton B. Burgess
*Attorney, Agent, or Firm*—Sughrue, Mion, Zinn, Macpeak & Seas, PLLC

[57] ABSTRACT

An automatic channel selecting and/or tuner diagnosing method for a double-tuner television receiver is provided. The method includes the following steps. Performing a first channel selection operation via a first tuner to search for a first channel on which a first broadcast signal is transmitted. Determining if the first tuner receives the first broadcast signal. Performing a second channel selection operation via a second tuner to search for a second channel on which a second broadcast signal is transmitted when the first tuner does not receive the first broadcast signal after performing the first channel selection operation. Determining if the second tuner receives the second broadcast signal. Outputting a first message indicating that the first tuner has a malfunction when the second tuner receives the second broadcast signal. Outputting a second message indicating that the first broadcast signal and/or the second broadcast signal have not been received when the second tuner does not receive the second broadcast signal after performing the second channel selection operation. Furthermore, an apparatus is provided for performing the method above. As a result of the method and apparatus above, the first and second tuners do not have to operated unnecessarily and a user can view television more comfortably.

17 Claims, 3 Drawing Sheets

METHOD AND APPARATUS FOR PERFORMING AUTOMATIC CHANNEL SELECTION AND AUTOMATIC TUNER DIAGNOSIS IN A DOUBLE-TUNER TELEVISION RECEIVER

FIELD OF THE INVENTION

The present invention relates to a double-tuner television receiver. More particularly, the present invention relates to a method for automatically selecting a channel and/or diagnosing a malfunction of a tuner in a double-tuner television receiver and relates to an apparatus which implements such method.

BACKGROUND OF THE INVENTION

A conventional double-tuner television receiver comprises two tuners which can input various signals broadcast on selected channels. A user can display a desired program corresponding to a particular broadcast signal by inputting a command to the television receiver to instruct one of the two tuners to search for and tune the channel on which the particular signal is broadcast. Furthermore, if the broadcast signal is not received by the tuner selected by the user, the other tuner may be designated to search for and tune the particular channel.

When the channel cannot readily be tuned by one of the tuners, the user must continually manipulate the tuners to search for the particular broadcast signal. Consequently, the life of the tuners is significantly reduced. Furthermore, if a tuner has a malfunction and is unable to receive a particular signal on a certain channel, such malfunction is not communicated to the user. As a result, the user unnecessarily and continuously attempts to instruct the malfunctioning tuner to receive the particular broadcast signal.

SUMMARY OF THE INVENTION

In order to overcome the problems above, an object of the present invention is to provide an automatic channel selecting method for a double-tuner television receiver. In such method, channel selection is automatically performed by a tuner receiving a broadcasting signal.

Another object of the present invention is to provide an automatic tuner diagnosing method for a double-tuner television receiver.

Still another object of the present invention is to is provide an apparatus for implementing the above automatic channel selecting and tuner diagnosing methods for a double-tuner television receiver.

In order to achieve the objects above, an automatic channel selecting and/or tuner diagnosing method for a double-tuner television receiver is provided. In particular, the method comprises the steps of: (a) performing a first channel selection operation via a first tuner to search for a first channel on which a first broadcast signal is transmitted; (b) determining whether said first tuner receives said first broadcast signal; (c) performing a second channel selection operation via a second tuner to search for a second channel on which a second broadcast signal is transmitted, wherein said step of performing said second channel selection operation is performed when said first tuner does not receive said first broadcast signal after performing said first channel selection operation; (d) determining whether said second tuner receives said second broadcast signal; (e) outputting a first message indicating that said first tuner has a malfunction, wherein said step of outputting said first message is performed when said second tuner receives said second broadcast signal; and (f) outputting a second message indicating that at least one of said first broadcast signal and said second broadcast signal have not been received, wherein said step of outputting said second message is performed when said second tuner does not receive said second broadcast signal after performing said second channel selection operation.

In order to further achieve the objects above, an automatic channel selecting and/or tuner diagnosing apparatus for a double-tuner television receiver is provided. Specifically, the apparatus comprises: a first tuner for receiving a first broadcast signal and converting said first broadcast signal into a first composite video signal; a second tuner for receiving a second broadcast signal and converting said second broadcast signal into a second composite video signal; a controller, wherein said controller outputs a first control signal to said first tuner and said second tuner to instruct said first tuner to perform a first channel selection operation or to instruct said second tuner to perform a second channel selection operation, wherein said controller receives said first composite video signal and said second composite video signal and determines a status of at least one of said first tuner and said second tuner, and wherein said controller outputs a second control signal which corresponds to said status; a demodulator for demodulating at least one of said first composite video signal and said second composite video signal to produce a corresponding demodulated video signal; an on screen display signal generator for inputting said second control signal and outputting a corresponding on screen display signal; and a video signal processor for inputting said demodulated video signal and said on screen display signal, converting said demodulated video signal and said on screen display signal into a processed signal, and outputting said processed signal to a display device.

BRIEF DESCRIPTION OF THE DRAWINGS

The above objects and advantages of the present invention will become more apparent by referring to the detailed description of the preferred embodiments and the corresponding drawings in which.

DETAILED DESCRIPTION OF THE PREFERRED EMBODIMENTS

Figure 3:
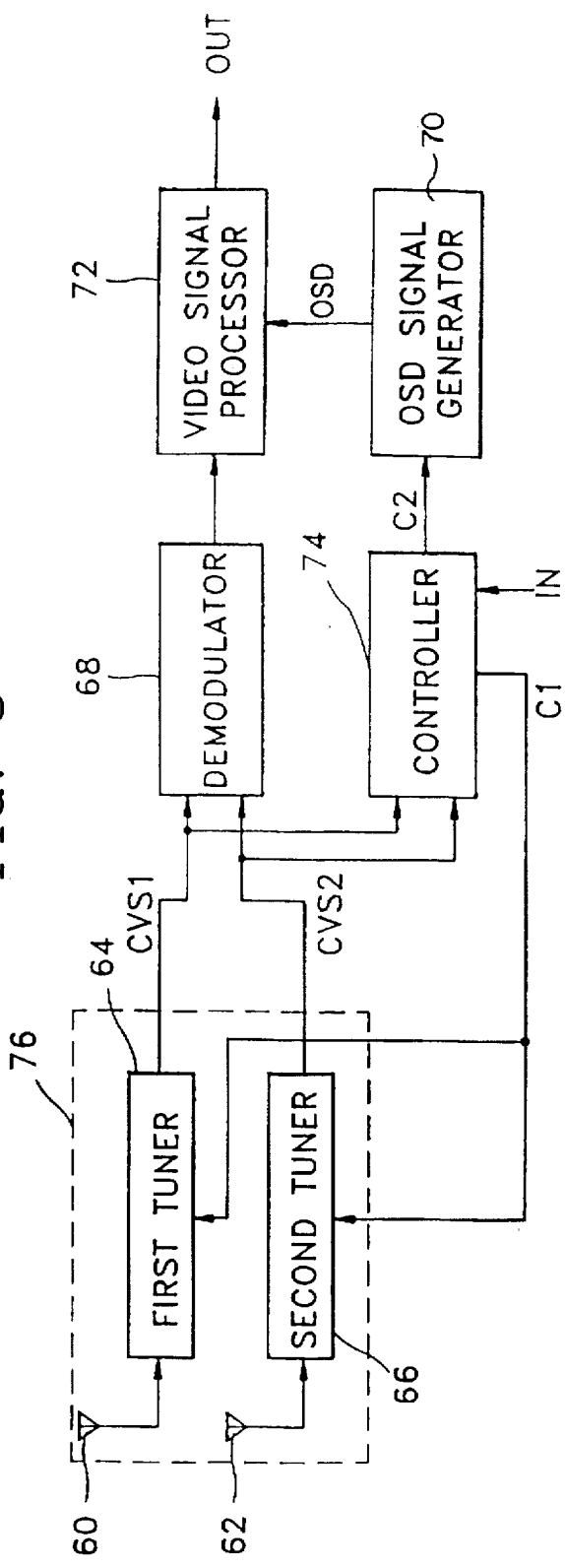
FIG. 3 is a block diagram of an automatic channel selecting and tuner diagnosing apparatus for a double-tuner television receiver.

One embodiment of an apparatus which is capable of automatically selecting a particular channel and automatically diagnosing the tuners of a double-tuner television is shown in FIG. 3. Specifically, the apparatus comprises a demodulator 68, an on screen display (OSD) signal generator 70, a video signal processor 72, a controller 74, and a tuner portion 76. Furthermore, the tuner portion 76 comprises a first tuner 64 connected to a first antenna 60 and a second tuner 66 connected to a second antenna 62.

The controller 74 inputs a command from a user selection device (e.g. a remote controller or keypad) (not shown) via an is input terminal IN. In response to the command, the controller 74 generates a first control signal C1 and outputs such signal C1 to the first and second tuners 64 and 66. Depending on the content of the first control signal C1, the signal C1 may activate the first tuner 64 and instruct the tuner 64 to tune 20 to a certain channel for inputting a particular broadcast signal via the antenna 60. On the other hand, the signal C1 may activate the second tuner 66 and instruct the tuner 66 to tune to a certain channel for inputting a particular broadcast signal via the antenna 62.

When the first tuner 64 inputs a broadcast signal, it demodulates the broadcast signal into a first composite video signal CVS1 and outputs such signal CVS1 to the demodulator 68 and the controller 74. The demodulator 68 converts the first composite video signal CVS1 into audio and video signals and outputs such signals to the video signal processor 72. Meanwhile, the controller 74 inputs the signal CVS1 and is able to determine whether or not the tuner 64 is correctly receiving a particular broadcast signal on a certain channel based on the signal CVS1. Accordingly, the controller 74 can output the first control signal C1 and/or a second control signal C2 in accordance with the signal CVS1.

Similarly, when the second tuner 66 inputs a broadcast signal, it demodulates the broadcast signal into a second composite video signal CVS2 and outputs such signal CVS2 to the demodulator 68 and the controller 74. The demodulator 68 transforms the second composite video signal CVS2 into audio is and video signals and supplies such signals to the video signal processor 72. In addition, the controller 74 inputs the signal CVS2 and is capable of determining whether or not the second tuner 66 is properly receiving a particular broadcast signal on a certain channel based on the signal CVS2. Thus, the controller 74 can output the first control signal C1 and/or the second control signal C2 in accordance with the signal CVS2.

The OSD signal generator 70 inputs the second control signal C2 from the controller 74 and outputs a corresponding OSD signal to the video signal processor 72. The OSD signal may contain information which relates to the status of one of the tuners 64 and 66 and/or the ability of one of the tuners 64 and 66 to receive a certain broadcast signal.

The video signal processor 72 inputs the audio and video signals supplied from the demodulator 68 and the OSD signal output from the OSD signal generator 70. The processor 72 may filter the input signals to produce filtered signals, process the filtered signals in accordance with double-wide and matrix processing techniques, and output the processed signals to a display driver.

Figure 4:
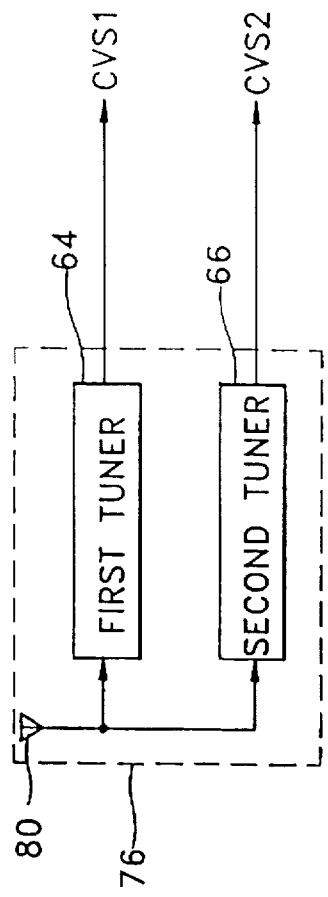
FIG. 4 illustrates another embodiment of the tuner portion shown in FIG. 3.

FIG. 4 illustrates another embodiment of the tuner portion 76 shown in FIG. 3. As shown in the figure, the tuner portion comprises first and second tuners 64 and 66 which output first and second composite video signals CVS1 and CVS2, respectively. However, the tuners 64 and 66 are commonly connected to a single antenna 80 instead of being connected to two separate antennas.

Figure 1:
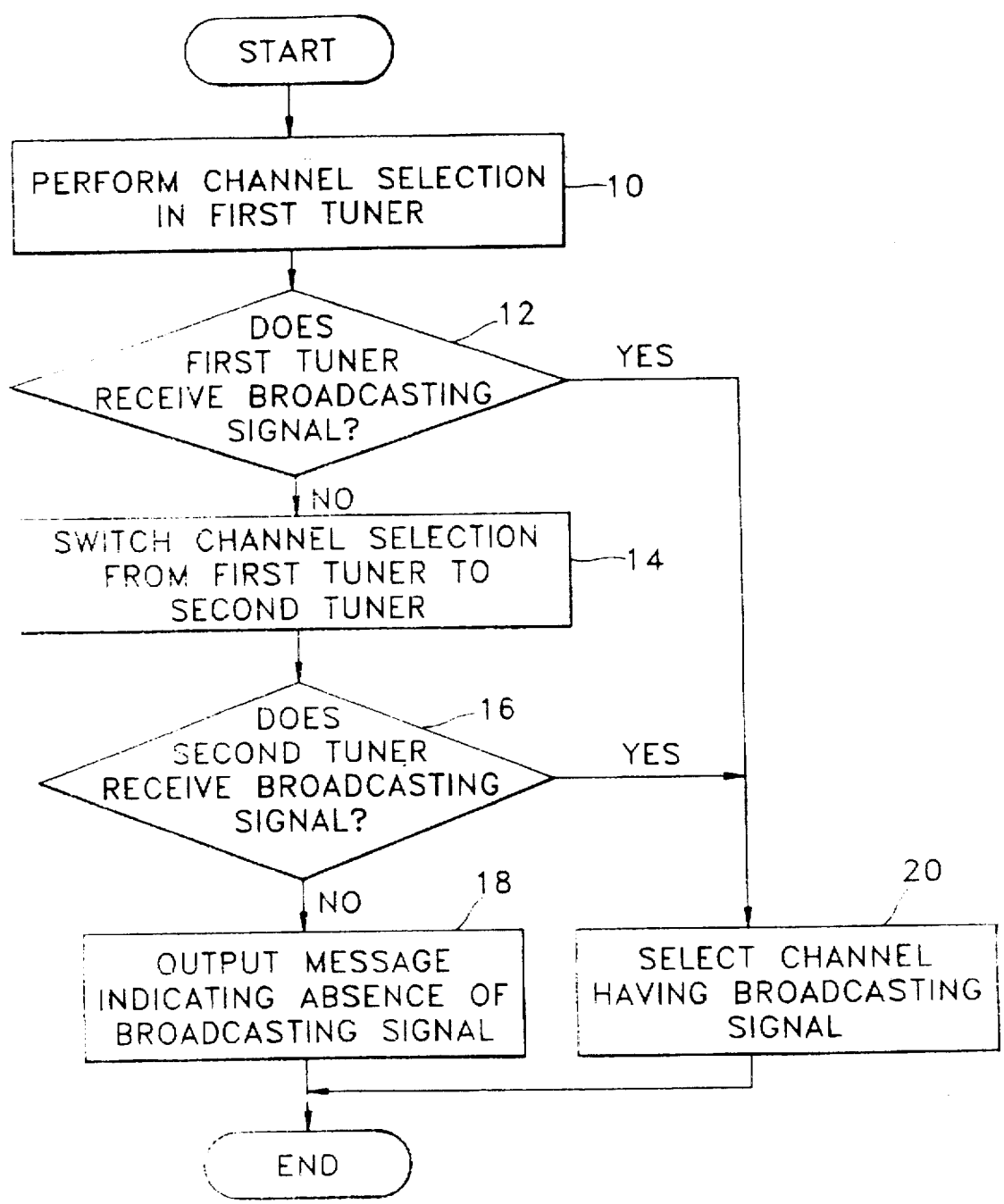
FIG. 1 is a flow chart of an automatic channel selecting method for a double-tuner television receiver according to the present invention.

An example of an automatic channel selecting method which may be implemented by the apparatuses shown in FIGS. 3 and 4 is illustrated in FIG. 1. In particular, when a user wants to select a certain channel, the user may depress an appropriate key on the user selection device (not shown) which causes a command to be input to the controller 74 via the input terminal IN. As a result, the controller 74 outputs the first control signal C1 to activate either the first tuner 64 or the second tuner 66.

When the first tuner 64 is selected, it performs a channel selection operation to search for the certain channel having a particular broadcast signal based on the first control signal C1 (step 10). Subsequently, the controller 74 inputs the first composite video signal CVS1 from the tuner 64 and determines whether or not the tuner 64 is receiving the particular broadcast signal (step 12). If the first tuner 64 has located the certain channel on which the particular signal is broadcast, the controller 74 causes the tuner 64 to select such channel (step 20). Then, the tuner 64 outputs the first composite video signal CVS1 corresponding to the particular broadcast signal to the demodulator 68.

On the other hand, if the particular signal is not received by the first tuner 64, the controller 74 outputs the first control signal C1 to activate the second tuner 66. Consequently, the tuner 66 performs a channel selection operation to search for the certain channel (step 14). Then, the controller 74 inputs the second composite video signal CVS2 from the tuner 66 to determine whether or not the tuner 66 is receiving the particular signal broadcast on the certain channel (step 16). If the second tuner 66 locates the certain channel on which the particular signal is broadcast, the controller 74 causes the tuner 66 to select such channel (step 20). Afterwards, the tuner 66 outputs the second composite video signal CVS2 corresponding to the particular broadcast signal to the demodulator 68.

However, if the second tuner 66 does not receive the particular signal, the controller 74 outputs the second control signal C2 to the OSD signal generator 70. In response to the signal C2, the generator 70 outputs an OSD signal which comprises a message indicating that neither tuner 64 or 66 is able to locate the certain channel and receive the particular broadcast signal (step 18). The OSD signal is input by a matrix unit (not shown) of the video signal processor 72, and the processor 72 outputs a corresponding message to the display driver (not shown) via the output terminal OUT.

The method shown in FIG. 1 can operate in various manners depending upon the content of the first control signal C1 and/or the manner in which the first and second tuners 64 and 66 perform the channel selection operations (steps 10 and 14). For example, if the first control signal C1 indicates a specific channel (e.g. channel number 4) to which the tuner 64 is to be tuned, the tuner 64 may perform the channel selection operation to search for channel number 4 (step 10). Subsequently, if the tuner 64 locates channel number 4 and receives the signal broadcast on such channel (step 12), the controller 74 causes the tuner 64 to tune to channel number 4 (step 20). As a result, the tuner 64 outputs the first composite video signal CVS1 corresponding to the signal broadcast on channel 4 to the demodulator 68.

However, if the tuner 64 is unable to tune to channel number 4 and receive the corresponding broadcast signal (step 12), the controller 74 outputs the first control signal C1 to instruct the second tuner 66 to perform the channel selection operation to attempt to tune to channel number 4 (step 14). If the second tuner 66 locates channel number 4 and receives the signal broadcast on such channel (step 16), the controller 74 causes the tuner 66 to tune channel number 4 (step 20). Consequently, the tuner 66 supplies the second composite video signal CVS2 relating to the signal broadcast on channel 4 to the demodulator 68.

On the other hand, if the second tuner 66 cannot not tune to channel number 4 and receive the particular signal (step 16), the controller 74 outputs the second control signal C2 to the OSD signal generator 70. Subsequently, the generator 70 outputs an OSD signal which comprises a message indicating that neither tuner 64 or 66 is able to locate and/or tune to channel number 4 to receive the particular broadcast signal (step 18).

In contrast to the operation above, the automatic channel selecting method may generally instruct either the tuner 64 or 66 to tune to the next available channel on which a broadcast signal is transmitted instead of instructing the tuner 64 or 66 to tune to a specific channel. In other words, the user may input a "tune to next channel command" via the user selection device instead of inputting a "tune to channel 4" command.

Upon receiving the "tune to next channel command", the controller 74 outputs a first control signal C1 instructing the first tuner 64 to tune to the next channel on which a broadcast signal is transmitted. Consequently, the tuner 64 performs the channel selection operation to search through the channels for a channel broadcasting a signal (step 10). If the tuner 64 locates a channel on which a signal is broadcast (step 12), the controller 74 causes the tuner 64 to tune to such channel (step 20). As a result, the tuner 64 outputs the first composite video signal CVS1 corresponding to the broadcast signal to the demodulator 68.

However, if the tuner 64 is unable to locate any channels on which a signal is broadcast (step 12), the controller 74 outputs the first control signal C1 to instruct the second tuner 66 to search through the channels to locate a channel transmitting a broadcast signal (step 14). If the second tuner 66 locates such a channel and receives a broadcast signal (step 16), the controller 74 causes the tuner 66 to tune to such channel (step 20). As a result, the tuner 66 supplies the second composite video signal CVS2 relating to the broadcast signal to the demodulator 68.

On the other hand, if the second tuner 66 cannot find any channels which are transmitting signals (step 16), the controller 74 outputs the second control signal C2 to the OSD signal generator 70. Consequently, the generator 70 outputs an OSD signal which comprises a message indicating that neither tuner 64 or 66 is able to locate and/or tune to a channel having a broadcast signal (step 18).

Figure 2:
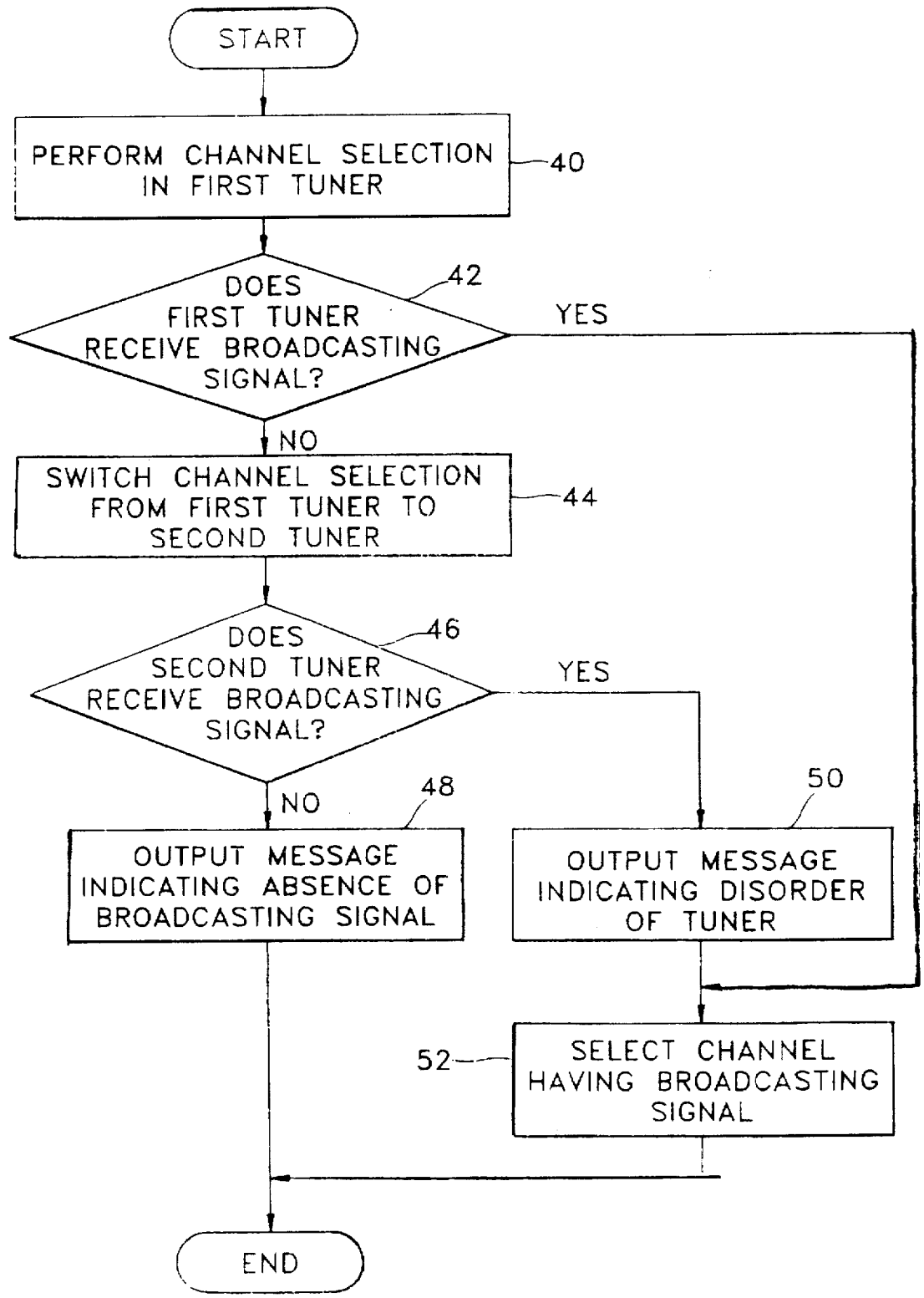
FIG. 2 is a flow chart of an automatic channel selecting and tuner diagnosing method for a double-tuner television receiver according to the present invention.

An example of an automatic channel selecting and tuner diagnosing method which may be implemented by the apparatuses shown in FIGS. 3 and 4 is illustrated in FIG. 2. As shown in the figure, when the first tuner 64 is activated, it performs a channel selection operation to search for a certain channel having a particular broadcast signal based on the first control signal C1 (step 40). Subsequently, the controller 74 inputs the first composite video signal CVS1 output from the tuner 64 and determines whether or not the tuner 64 is receiving the particular broadcast signal (step 42). If the first tuner 64 has located the certain channel on which the particular signal is broadcast, the controller 74 causes the tuner 64 to select such channel (step 52). Then, the tuner 64 outputs the first composite video signal CVS1 corresponding to the particular broadcast signal to the demodulator 68.

On the other hand, if the particular signal is not received by the first tuner 64, the controller 74 outputs the first control signal C1 to activate the second tuner 66. As a result, the tuner 66 performs a channel selection operation to search for the certain channel (step 44). Then, the controller 74 inputs the second composite video signal CVS2 from the tuner 66 to determine whether or not the tuner 66 is receiving the particular signal broadcast on the certain channel (step 46).

If the second tuner 66 does not receive the particular signal, the controller 74 outputs the second control signal C2 to the OSD signal generator 70. In response to the signal C2, the generator 70 outputs an OSD signal which comprises a message indicating that neither tuner 64 or 66 is able to locate the certain channel and receive the particular broadcast signal (step 48). The OSD signal is input by the matrix unit (not shown) of the video signal processor 72, and the processor 72 outputs a corresponding message to the display driver (not shown) via the output terminal OUT.

On the other hand, if the second tuner 66 locates the certain channel and receives the particular broadcast signal, the controller 74 determines that the first tuner 64 has a malfunction. Accordingly, the controller 74 outputs the second control signal C2 to the OSD signal generator 70, and the generator 70 outputs an OSD signal which indicates that the first tuner 64 is not operating properly (step 50). The OSD signal is input by the matrix unit (not shown) of the video signal processor 72, and the processor 72 outputs a corresponding message to the display driver (not shown) via the output terminal OUT.

Subsequently, the controller 74 causes the tuner 66 to select the channel on which the particular signal is broadcast (step 52). Afterwards, the tuner 66 outputs the second composite video signal CVS2 corresponding to the particular broadcast signal to the demodulator 68.

As described above, the method and apparatus of the present invention are able to automatically select channels and diagnose tuners of a double-tuner television receiver. Therefore, if the currently activated tuner is unable to receive a particular broadcast signal, the present invention is capable of automatically activating another tuner and selecting a channel via the other tuner. Furthermore, if the other tuner is capable of receiving the broadcast signal, the present invention is able to notify the user that the former tuner has a malfunction. Accordingly, the tuners of the television can be prevented from performing unnecessary operations, and the user can view television more comfortably.

Furthermore, the embodiments described above are merely illustrative, and modifications of such embodiments may occur to those skilled in the art. Accordingly, this invention is not to be regarded as limited to the embodiments disclosed herein, but is to be limited only as defined by the appended claims.

What is claimed is:

1. An automatic channel selecting and/or tuner diagnosing method for a double-tuner television receiver, comprising the steps of:

(a) performing a first channel selection operation via a first tuner to search automatically for a first channel on which a first broadcast signal is transmitted;

(b) determining whether said first tuner is properly tuned to said first broadcast signal;

(c) performing a second channel selection operation via a second tuner to search automatically for a second channel on which a second broadcast signal is transmitted, wherein said step of performing said second channel selection operation is performed when said first tuner is not properly tuned to said first broadcast signal after performing said first channel selection operation;

(d) determining whether said second tuner is properly tuned to said second broadcast signal: and (e) generating a first message indicating that at least one of said first broadcast signal and said second broadcast signal cannot be properly tuned, wherein said step of generating said first message is performed when said second tuner is not properly tuned to said second broadcast signal after performing said second channel selection operation.

2. The method as claimed in claim 1, further comprising the steps of:
- (f) automatically tuning said first tuner to said first channel when said first tuner is properly tuned to said first broadcast signal; and
- (g) automatically tuning said second tuner to said second channel when said second tuner is properly tuned to said second broadcast signal.

3. The method as claimed in claim 1, wherein said first channel and said second channel are the same channel and said first broadcast signal and said second broadcast signal are the same broadcast signal.

4. The method as claimed in claim 1, wherein said first channel and said second channel are different channels and said first broadcast signal and said second broadcast signal are different broadcast signals.

5. An automatic channel selecting and/or tuner diagnosing method for a double-tuner television receiver, comprising the steps of:
- (a) performing a first channel selection operation via a first tuner to search automatically for a first channel on which a first broadcast signal is transmitted;
- (b) determining whether said first tuner is properly tuned to said first broadcast signal;
- (c) performing a second channel selection operation via a second tuner to search automatically for a second channel on which a second broadcast signal is transmitted, wherein said step of performing said second channel selection operation is performed when said first tuner is not properly tuned to said first broadcast signal after performing said first channel selection operation;
- (d) determining whether said second tuner is properly tuned to said second broadcast signal; and
- (e) generating a first message indicating that said first tuner has a malfunction, wherein said step of outputting said first message is performed when said second tuner is properly tuned to said second broadcast signal.

6. The method as claimed in claim 5, further comprising the step of:
- (f) generating a second message indicating that at least one of said first broadcast signal and said second broadcast signal cannot be properly tuned, wherein said step of outputting said second message is performed when said second tuner is not properly tuned to said second broadcast signal after performing said second channel selection operation.

7. The method as claimed in claim 5, further comprising the steps of:
- (f) automatically tuning said first tuner to said first channel when said first tuner is properly tuned to said first broadcast signal; and
- (g) automatically tuning said second tuner to said second channel when said second tuner is properly tuned to said second broadcast signal.

8. The method as claimed in claim 5, wherein said first channel and said second channel are the same channel and said first broadcast signal and said second broadcast signal are the same broadcast signal.

9. The method as claimed in claim 5, wherein said first channel and said second channel are different channels and said first broadcast signal and said second broadcast signal are different broadcast signals.

10. An automatic channel selecting and/or tuner diagnosing apparatus for a double-tuner television receiver comprising:
- a first tuner for receiving a first broadcast signal and converting said first broadcast signal into a first composite video signal;
- a second tuner for receiving a second broadcast signal and converting said second broadcast signal into a second composite video signal;
- a controller,
  - wherein said controller generates a first control signal to said first tuner and said second tuner to instruct said first tuner to perform a first channel selection operation,
  - wherein said controller receives said first composite video signal and said second composite video signal and determines a status of at least one of said first tuner and said second tuner, and
  - wherein said controller generates a second control signal corresponding to said status, which indicates when said first tuner or said second tuner has malfunctioned and/or is not properly tuned to said first and second broadcast signals, in order to display a message when said first tuner or said second tuner has malfunctioned and/or is not properly tuned to said first and second broadcast signals.

11. The apparatus as claimed in claim 10, comprising:
- a demodulator for demodulating at least one of said first composite video signal and said second composite video signal to produce a corresponding demodulated video signal;
- an on screen display signal generator for inputting said second control signal and outputting a corresponding on screen display signal; and
- a video signal processor for inputting said demodulated video signal and said on screen display signal, converting said demodulated video signal and said on screen display signal into a processed signal, and outputting said processed signal to a display device.

12. The apparatus as claimed in claim 10, wherein said first tuner inputs said first broadcast signal via a single antenna and said second tuner inputs said second broadcast signal via said single antenna.

13. The apparatus as claimed in claim 10, wherein said first tuner inputs said first broadcast signal via a first antenna and said second tuner inputs said second broadcast signal via a second antenna.

14. The apparatus as claimed in claim 10, wherein said controller outputs said first control signal to said first tuner to instruct said first tuner to perform a first channel selection operation to search for a first channel on which a first broadcast signal is transmitted,
- wherein said controller determines whether or not said first tuner is properly tuned to said first broadcast signal based on said first composite video signal output from said first tuner,
- wherein said controller outputs said first control signal to said second tuner to instruct said second tuner to perform a second channel selection operation to search for a second channel on which a second broadcast signal is transmitted, and
- wherein said first control signal is output to instruct said second tuner to perform said second channel selection operation when said first tuner is not properly tuned to said first broadcast signal after performing said first channel selection operation.

15. The apparatus as claimed in claim 14, wherein said first channel and said second channel are the same channel and said first broadcast signal and said second broadcast signal are the same broadcast signal.

16. The apparatus as claimed in claim 14, wherein said controller determines whether or not said second tuner is properly tuned to said second broadcast signal based on said second composite video signal, wherein said controller generates said second control signal comprising a first message indicating that said first tuner has a malfunction, wherein said second control signal comprising said first message is output when said second tuner is properly tuned to said second broadcast signal after performing said second channel selection operation.

17. The apparatus as claimed in claim 16, wherein said controller generates said second control signal comprising a second message indicating that at least one of said first broadcast signal and said second broadcast signal cannot be properly tuned, wherein said second control signal comprising said second message is generated when said second tuner is not properly tuned to said second broadcast signal after performing said second channel selection operation.

* * * * *